(12) United States Patent
Speidell et al.

(10) Patent No.: US 6,275,122 B1
(45) Date of Patent: Aug. 14, 2001

(54) ENCAPSULATED MEMS BAND-PASS FILTER FOR INTEGRATED CIRCUITS

(75) Inventors: James L. Speidell, Poughquag; James F. Ziegler, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/375,942

(22) Filed: Aug. 17, 1999

(51) Int. Cl.$^7$ .................................................. H03H 9/46
(52) U.S. Cl. ........................................ 333/186; 333/202
(58) Field of Search ..................................... 333/186, 202

(56) References Cited

U.S. PATENT DOCUMENTS

| | | | |
|---|---|---|---|
| 3,634,787 | 1/1972 | Newell | 333/186 |
| 3,983,477 | 9/1976 | Stuchly et al. | 324/117 R |
| 4,232,265 | 11/1980 | Smirnov | 324/260 |
| 5,537,083 | * 7/1996 | Lin et al. | 333/186 |
| 5,594,331 | 1/1997 | White et al. | 324/117 R |
| 5,696,491 | 12/1997 | White et al. | 340/657 |

OTHER PUBLICATIONS

K.S. Lebouitz et al., "Vacuum Encapsulation of Resonant Devices Using Permeable Polysilicon", *Twelfth International Conference on Micro Electro Mechanical Systems, 1999, MEMS '99*, Jan. 1999, pp 470–475.*

H.A.C. Tilmans et al., "(Electro–) Mechanical Characteristics of Electrostatically Driven Vacuum Encapsulated Polysilicon Resonators", *IEEE Transactions on Ultrasonics, Ferroelectrics and Frequency Control*, Jan. 1994, pp. 4–6 vol. 41. No. 1.*

L. Lin et al., "Microelectromechanical Filters for Signal Processing", *Journal of Microelectromechanical Systems*, vol. 7, No. 3, Sep. 1998, pp. 286–294.*

R.T. Howe, "Applications of Silicon Micromachining to Resonator Fabrication", *Proceedings of the 1994 IEEE International Frequency Control Symposium*, Jun. 1994, pp. 2–7.*

"Micromachined Devices for Wireless Communications", by Nguyen, et al., Proceedings of the IEEE, vol. 86, No. 8, Aug. 1998, pp. 1756–1768.

"Surface Micromachining for Microelectromechanical Systems", by Bustillo, et al., Proceedings of the IEEE, vol. 86, No. 8, Aug. 1998, pp. 1552–1574.

"High–Q Micromechanical Oscillators and Filters for Communications", by Nguyen, et al., 1997 IEEE International Symposium on Circuits and Systems, Jun. 9–12, 1997, Hong Kong, pp. 2825–2828.

"Bulk Micromachining of Silicon", by Kovacs, et al., Proceedings of the IEEE, vol. 86, No. 8, Aug. 1998, pp. 1536–1551.

(List continued on next page.)

*Primary Examiner*—Robert Pascal
*Assistant Examiner*—Barbara Summons
(74) *Attorney, Agent, or Firm*—Scully, Scott, Murphy & Presser; Daniel P. Morris, Esq.

(57) ABSTRACT

Integrated circuit fabrication technique for constructing novel MEMS devices, specifically band-pass filter resonators, in a manner compatible with current integrated circuit processing, and completely encapsulated to optimize performance and eliminate environmental corrosion. The final devices may be constructed of single-crystal silicon, eliminating the mechanical problems associated with using polycrystalline or amorphous materials. However, other materials may be used for the resonator. The final MEMS device lies below the substrate surface, enabling further processing of the integrated circuit, without protruding structures. The MEMS device is about the size of a SRAM cell, and may be easily incorporated into existing integrated circuit chips. The natural frequency of the device may be altered with post-processing or electronically controlled using voltages and currents compatible with integrated circuits.

15 Claims, 8 Drawing Sheets

OTHER PUBLICATIONS

"Development of Miniature Filters for Wireless Applications", by Lakin, et al., IEEE Transactions on Microwave Theory and Techniques, No. 43, No. 12, Dec. 1995, pp. 2933–2939.

"Micromachined Micropackaged Filter Banks", by Brown, et al., IEEE Microwave and Guided Wave Letters, vol. 8, No. 4, Apr. 1998, pp. 158–160.

"Fabrication of high frequency nanometer scale mechanical resonators from bulk Si crystals", by Cleland, et al., 1996 American Institute of Physics, Oct. 28, 1996, pp. 2653–2655.

"Frequency–Selective MEMS for Miniaturized Communication Devices", by Nguyen, 1998 IEEE Aerospace Conference Proceedings, vol. 1, Mar. 21–28, 1998, pp. 445–460.

"Electrothermal Frequency Tuning of Folded and Coupled Vibrating Micromechanical Resonators", by Syms, Journal of Microelectromechanical Systems, vol. 7,, No. 2, Jun. 1998, pp. 164–171.

* cited by examiner

MEMS Cantilever RF Band Pass Filter

ENCAPSULATED MEMS BAND-PASS FILTER FOR INTEGRATED CIRCUITS

BACKGROUND OF THE INVENTION

1. Field of the Invention

The present invention is directed to systems and methods for fabricating integrated circuit band-pass filters, and particularly a process for manufacturing integrated circuit (IC) filters using micro electro-mechanical system (MEMS) technology that involves the encapsulation of a single-crystal MEMS band-pass filter in a vacuum environment, at or below the substrate surface using standard processing, compatible with other standard integrated circuit devices, and, in a manner that eliminates the need for precision lithography.

2. Discussion of the Prior Art

Micro Electro-Mechanical Systems (MEMS) technology is currently implemented for the fabrication of narrow bandpass filters (high-Q filters) for various UHF and IF communication circuits. These filters use the natural vibrational frequency of micro-resonators to transmit signals at very precise frequencies while attenuating signals and noise at other frequencies. FIG. 1 illustrates a conventional MEMS bandpass filter device 10 which comprises a semiconductive resonator structure 11, e.g., made of polycrystalline or amorphous material, suspended over a planar conductive input structure 12, which is extended to a contact 13. An alternating electrical signal on the input 12 will cause an image charge to form on the resonator 11, attracting it and deflecting it downwards. If the alternating signal frequency is similar to the natural mechanical vibrational frequency of the resonator, the resonator may vibrate, enhancing the image charge and increasing the transmitted AC signal. The meshing of the electrical and mechanical vibrations selectively isolates and transmits desired frequencies for further signal amplification and manipulation. It is understood that the input and output terminals of this device may be reversed, without changing its operating characteristics.

Typically, MEMS resonator filter devices 10 are fabricated by standard integrated circuit masking/ deposition/ etching processes. Details regarding the manufacture and structure of MEMS band-pass filters may be found in the following references: 1) C. T. -C. Nguyen, L. P. B. Katehi and G. M. Rebeiz "Micromachined Devices for Wireless Communications", Proc. IEEE, 86, 1756–1768; 2) J. M. Bustillo, R. T. Howe and R. S. Muller "Surface Micromachining for Microelectromechanical Systems", Proc. IEEE, 86, 1552–1574 (1998); 3) C. T. -C. Nguyen, "High-Q Micromechanical Oscillators and Filters for Communications", IEEE Intl. Symp. Circ. Sys., 2825–2828 (1997); 4) G. T. A. Kovacs, N. I. Maluf and K. E. Petersen, "Bulk Micromachining of Silicon", Proc. IEEE 86, 1536–1551 (1998); 5) K. M. Lakin, G. R. Kline and K. T. McCarron, "Development of Miniature Filters for Wireless Applications", IEEE Trans. Microwave Theory and Tech., 43, 2933–2939 (1995); and, 6) A. R. Brown, "Micromachined Micropackaged Filter Banks", IEEE Microwave and Guided Wave Lett.,8, 158–160 (1998).

The reference 7) N. Cleland and M. L. Roukes, "Fabrication of High Frequency Nanometer Scale Mechanical Resonators from Bulk Si Crystals", Appl. Phys. Lett, 69, 2653–2655 (1996) describes the advantages of using single crystal resonators as band-pass filters. The references 8) C. T. -C. Nguyen, "Frequency-Selective MEMS for Miniaturized Communication Devices", 1998 IEEE Aerospace Conf. Proc., 1, 445–460 (1998) and 9) R. A. Syms, "Electrothermal Frequency Tuning of Folded and Coupled Vibrating Micromechanical Resonators, J. MicroElectroMechanical Sys., 7, 164–171 (1998) both discuss the effects of heat on the stability of micro-mechanical band-pass filters. Of particular relevance as noted in these references is the acknowledgment that the existing processes for making MEMS bandpass filters have serious drawbacks. For instance, as most resonators are made of polycrystalline or amorphous materials to simplify fabrication, there is exhibited an increase in mechanical energy dissipation which softens the natural frequency of oscillation, as noted in above-mentioned references 1)–3). Etching polycrystalline materials does not allow for device features smaller than the polycrystalline grain size, which creates rough surfaces and prevents precise mechanical characteristics. For example, references entitled "Micromachined Devices for Wireless Communications", "Surface Micromachining for Micro-electromechanical Systems", both detail the problems when polycrystalline material is used in MEMS resonators. Additionally, in reference 7) there is described the construction of resonators made of single-crystal silicon including a description of an attempt to use complex dry-etch techniques to obtain single-crystal resonators. The reference reports such resonator structures having scalloped edges, which reduces the precision of the final mechanical performance to that of polycrystalline structures. That is, their etch-process produced surface roughness that was similar to that of polycrystalline materials.

Other attempts to use single-crystal silicon have been reviewed in reference 4). However, these attempts were made to eliminate the poor device performance when polycrystalline materials were used for construction. Most used anisotropic etches to undercut single-crystal silicon surfaces and construct resonators (and other structures). In all cases, the structures were quite large, in part to minimize the effects of surface roughness and non-parallel surfaces on the device performance. Since the devices were very large, they were useful only for low-frequency applications (below 100 MHz), which is of limited usefulness as a communication frequency filter in the commercial band of 300–6000 MHz.

A further limitation of all MEMS band-pass structures is that they are formed above the silicon surface (see references 1–9), making the structures incompatible with standard integrated circuit fabrication, since it prevents "planarization". After the devices of an integrated circuit have been fabricated, the wafer enters its final processing which is called "metallization" and "planarization". Before this step, all the devices on the wafer are isolated, and for integration they must be connected together with metal wires. In modern devices, the wiring is done as a series of layers, each containing wiring in certain directions (i.e., metallization). After each layer is deposited, the wafer surface is smoothed, i.e., is planarized so that subsequent layers of wiring may be deposited on a smooth surface. Planarization is typically done by chemical-mechanical polishing (CMP processing) or by melting a thin layer of glass over the surface. If there is a micro-mechanical device protruding up above the surface, it would be destroyed by either of the above planarization processes.

Finally, most MEMS band-pass filter structures have been "open" structures, i.e. on top of the substrate and operating in air. References 1)–3) report that operating resonators in air adds significant friction to the system, reducing the device efficiency.

Prior patented devices such as described in U.S. Pat. No. 3,634,787 (1972), U.S. Pat. No. 3,983,477 (1976), and U.S. Pat. No. 4,232,265 A (1980) describe similar mechanical resonatored structures, but which are incompatible with integrated circuit processing.

For instance, U.S. Pat. No. 3,634,787 describes an electro-mechanical resonator band-pass filter device having a mechanical component consisting of a support being a unitary body of semiconductor material and having a piezo-electric field effect transducer therein. Thus, its electrical operation relies upon the piezoelectrical effect. U.S. Pat. No. 3,983,477 describes a ferromagnetic element tuned oscillator located close to a high-voltage current carrying conductor, however, as such, its electrical operation relies on the ferromagnetic effect. U.S. Pat. No. 4,232,265 A describes a device for converting the intensity of a magnetic or an electromagnetic field into an electric signal wherein movable elements are made as ferromagnetic plates. Likewise, its electrical operation relies upon the ferromagnetic effect. U.S. Pat. No. 5,594,331 describes a self-excitation circuitry connected to a resonator to process induced variable frequency voltage signals in a resonant pass band and is of exemplary use as a power line sensor. Likewise, U.S. Pat. No. 5,696,491 describes a microelectromechanical resonating resonator which responds to physical phenomenon by generating an induced variable frequency voltage signal corresponding to the physical phenomenon and thus, does not lend itself to manufacture by current integrated circuit fabrication technology.

It would thus be highly desirable to construct an IC MEMS filter device in a manner consistent with current integrated circuit fabrication techniques that avoids completely or reduces significantly all of the above-described limitations.

Furthermore, it would be highly desirable to construct an IC MEMS filter device in a manner consistent with current integrated circuit fabrication techniques including features for removing problems of environmental contamination and also the deleterious effects of air on the vibrating resonator.

SUMMARY OF THE INVENTION

It is an object of the present invention to provide an improved IC MEMS resonator device of a construction that lends itself to manufacture in accordance with current IC manufacturing techniques and that overcomes the fundamental weaknesses as outlined above.

Particularly, according to one aspect of the invention, there is provided a fabrication technique for constructing novel MEMS devices, specifically band-pass filter resonators, in a manner compatible with current integrated circuit processing, and completely encapsulated to optimize performance and eliminate environmental corrosion. The final devices may be constructed of single-crystal silicon, eliminating the mechanical problems associated with using polycrystalline or amorphous materials. However, according to another aspect of the invention, other materials such as polycrystalline or amorphous silicon may be used for the resonator. The final MEMS device lies at or below the substrate surface, enabling further processing of the integrated circuit, without protruding structures.

Advantageously, the MEMS device of the invention is about the size of a SRAM cell, and may be easily incorporated into existing integrated circuit chips. The natural frequency of the device may be altered with post-processing, or electronically controlled using voltages and currents compatible with integrated circuits.

BRIEF DESCRIPTION OF THE DRAWING

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1:
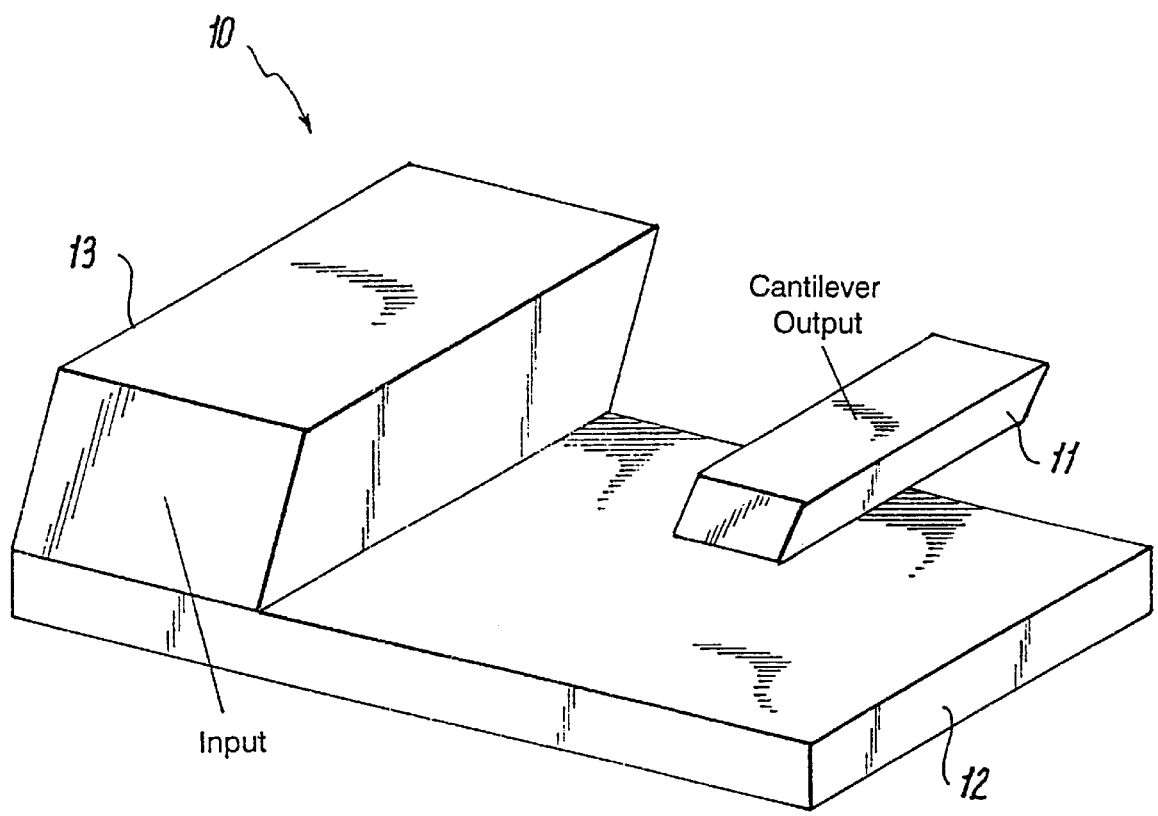
FIG. 1 is a schematic diagram of a conventional MEMS bandpass filter device of a suspended resonator design.
Figure 2A:
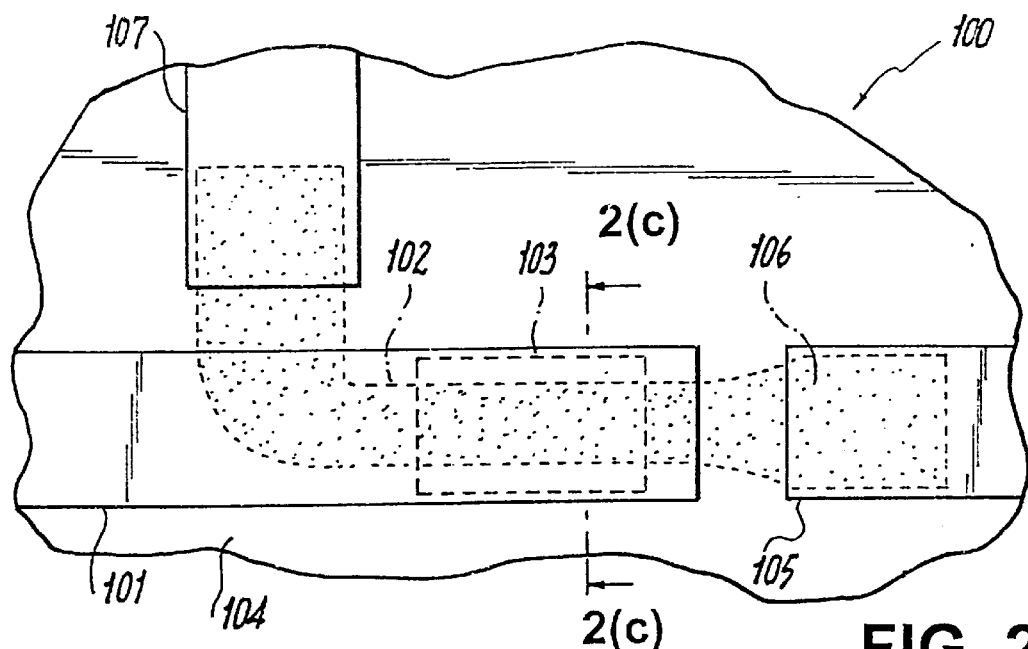
FIGS. 2(a)–2(c) illustrate respective top, side and end views of an encapsulated MEMS bandpass filter 100 having a suspended resonator with a third contact for possible electrical frequency tuning.
Figure 2B:
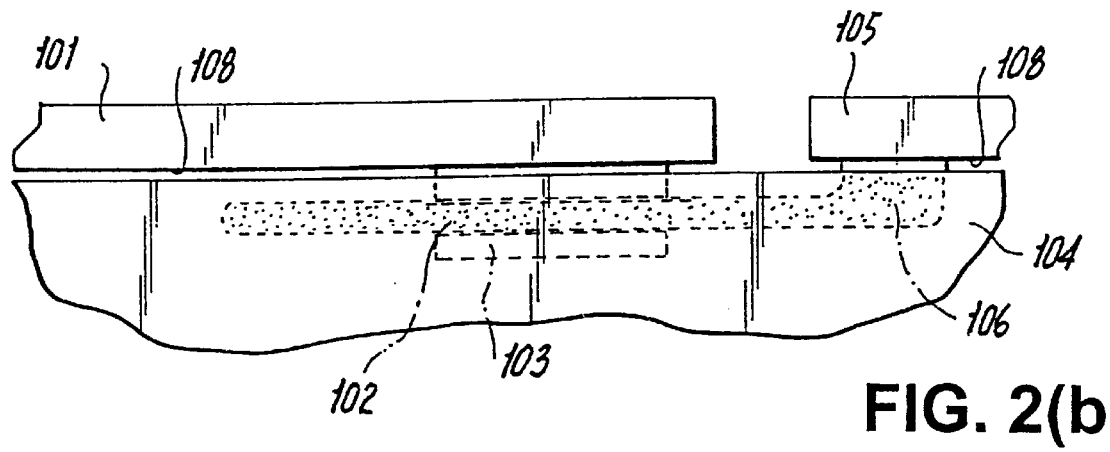
Figure 2C:
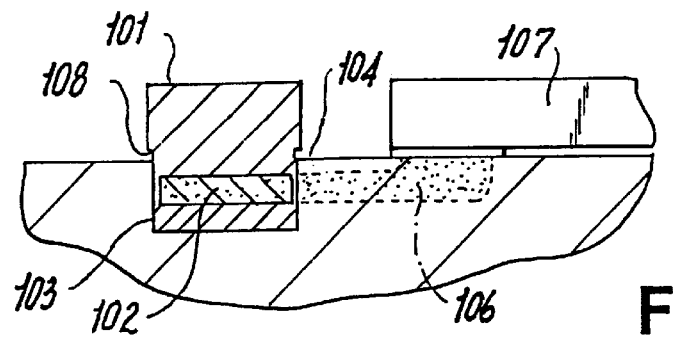

FIGS. 2(a), 2(b) and 2(c) illustrate respective top, side, and edge views of the novel encapsulated resonator MEMS bandpass filter device 100 manufactured according to a first embodiment of the invention. As shown in FIGS. 2(a) and 2(b), the device 100 includes a conducting wire input or contact terminal 101 that is suspended over a vacuum cavity 103 containing a conducting resonator 102 which is constructed at or below a primary surface 104 of the device. As shown, the resonator is connected to output wire or contact terminal 105. It should be understood that the input (101) and output (105) terminals of this device may be reversed, without changing its operating characteristics, but for simplicity the input and output contacts will be discussed as shown in FIG. 2(b). In operation, an alternating signal on the input 101 causes an image charge to form on the resonator 102, attracting it and deflecting it upwards. If the alternating signal frequency is similar to the natural mechanical vibrational frequency of the resonator, the resonator may vibrate, enhancing the image charge and increasing the capacitively coupled AC signal. This meshing of the electrical and mechanical vibrations selectively isolates and transmits desired frequencies for further signal amplification and manipulation.

As shown in the end view of the device in FIG. 2(c), the single-crystal resonator 102 suspended in the vacuum cavity 103 under input conductor 101. The side view of FIG. 2(b) shows the same resonator 102 clamped at both ends, under the input conductor. As further shown, all conductors are electrically isolated from the substrate by an insulating layer 108, except where a contact purposely is made. The resonator 102 is made electrically conductive by a buried implantation layer 106, which also connects it to the output conductor 105. With resonator dimensions of 1 mm×1 mm, 0.3 mm thickness, for example, the resonant frequency may range from about 500 MHz–800 MHz, with a first harmonic in the band of 3–5 GHz, using standard theory of vibrating bar frequencies when clamped at both ends (see Ref. 11).

Additionally shown in FIGS. 2(a)–2(c) is a third contact 107 which is electrically connected to the resonator 102 by the same buried conducting layer 106. The insulating layer 108 prevents electrical contact between the buried layer and input conductor 101. Conductor 107 may be used for tuning the resonator frequency either by applying DC bias relative to the input contact 101 which will apply internal stress to the resonator, or by applying DC bias relative to the output contact 105 which will cause a current to flow through the resonator, increasing its temperature. Both types of bias change the modulus of elasticity of the resonator, resulting in a change of its fundamental natural vibrational frequency.

That is, as described in the reference to H. J. McSkimin, J. Appl. Phys., 24, 988 (1953), and Yu. A. Burenkov and S. P. Nikanorov, Sov. Phys. Sol. State, 16, 963 (1974) the elastic constant of single crystal silicon varies with temperature. Further as described in the reference H. Guckel, Tech. Digest, IEEE Solid-State Sensor and Actuator Workshop, June, 1988, pp. 96–99, the elastic constant of polycrystalline silicon varies with temperature. In accordance with these references, the heating of silicon by 100° C. will change its elastic constant by about 0.9%, which may modify the resonator natural frequency by about 0.4%. For a 1 GHz natural frequency, this provides a tuning band of 4 MHz by controlling the resonator temperature. Measurements of such frequency changes may be made in accordance with conventional techniques (see above-mentioned references 8 and 9). In accordance with the invention, the thermal properties are used to tune the device, and improve its performance and flexibility.

Figure 3A:
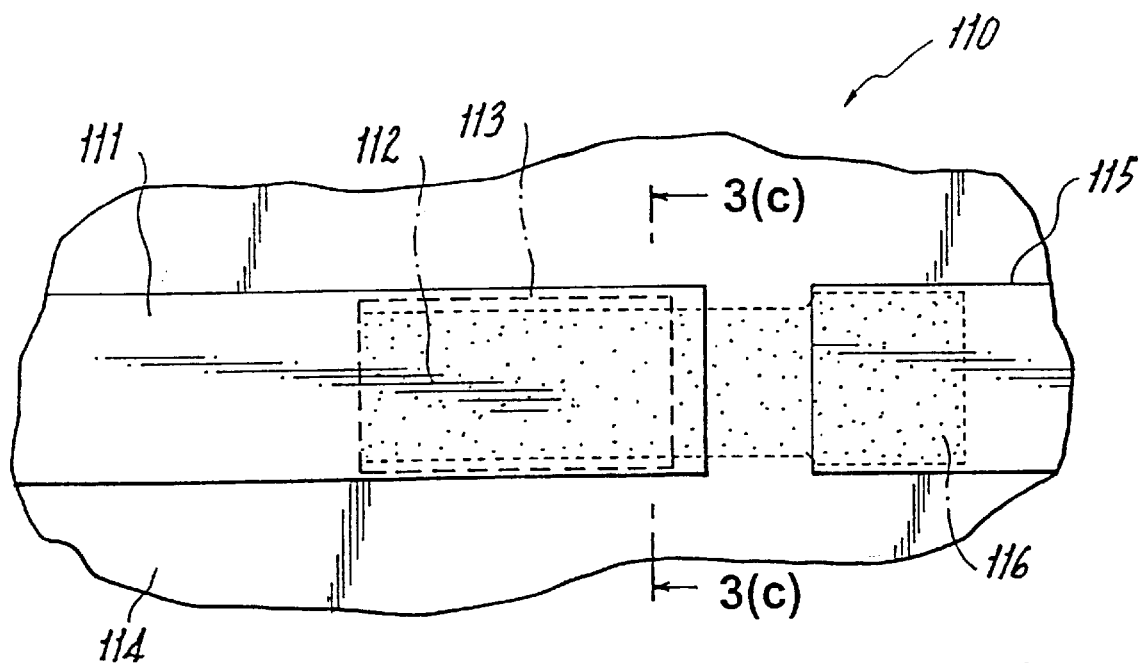
FIGS. 3(a)–3(c) illustrate respective top, side and end views of an encapsulated MEMS bandpass filter 110 having a suspended resonator without a third contact for electrical tuning.
Figure 3B:
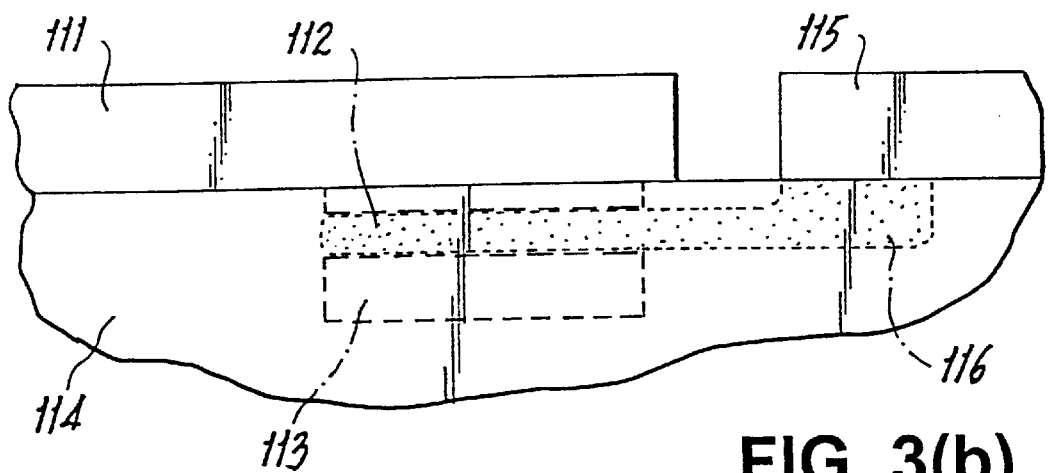
Figure 3C:
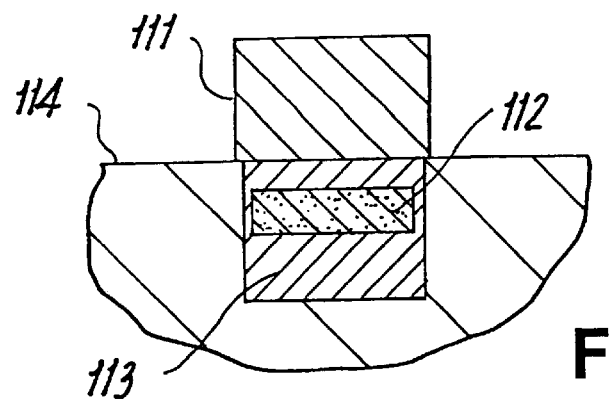

A variation of the device 100 is illustrated in FIGS. 3(a)–3(c) which show respective top, side and end views of an encapsulated resonator device structure 110 according to a second embodiment of the invention. In this embodiment, the resonator device 110 includes an input contact 111 which spans cavity 113 that contains resonator 112 which straddles the cavity and is free to vibrate. The resonator is electrically connected by a deep implant layer 116 to an output pad 115, which propagates the final filtered signal. The input contact 111 is capacitively coupled to the resonator 112, so that the input signal will cause the resonator to vibrate. The resonator will have a natural frequency of vibration, based on its dimensions and material, and signals with this frequency (or its harmonics) will be preferentially propagated through the resonator to the output terminal 115. This variation does not use a separate tuning contact, and any real-time tuning (after processing is completed) must be done by a DC voltage bias between the input and output conductors, applying stress to the resonator.

The devices illustrated in FIGS. 2 and 3, both show the resonator perpendicular to the input conductor. A variation of these structures is now described with respect to FIGS. 4(a)–4(c) which illustrate a resonator device structure 200 according to a third embodiment of the invention.

Figure 4A:
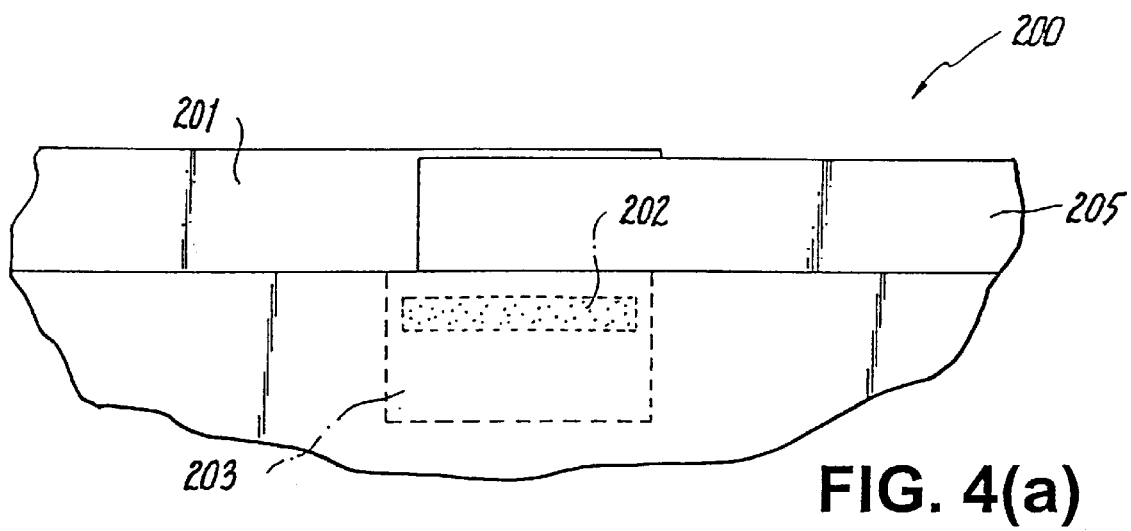
FIGS. 4(a)–4(c) illustrate respective side, top and end views of an encapsulated MEMS bandpass filter 200 with the resonator transverse to the input conductor, with a third contact for possible electrical frequency tuning.
Figure 4B:
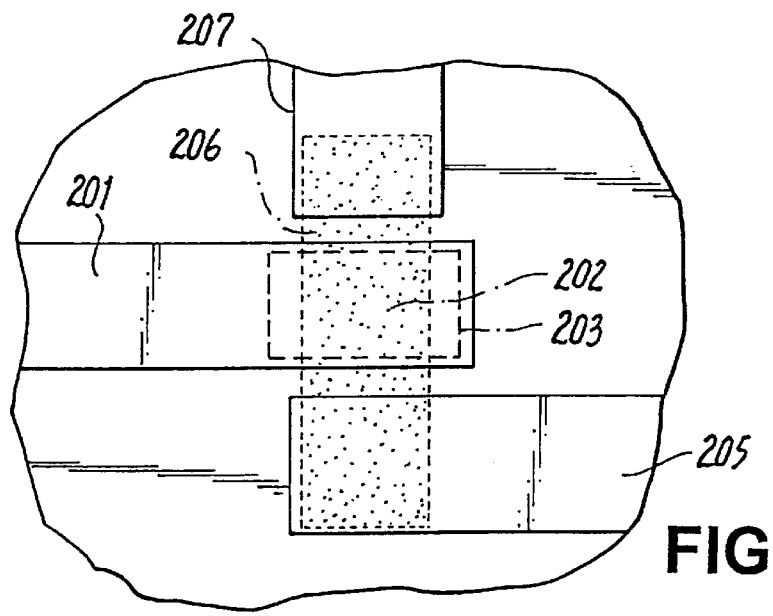
Figure 4C:
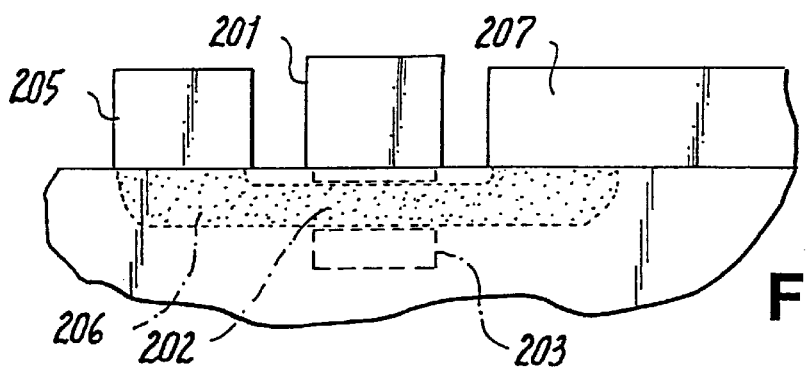

In FIG. 4(a), there is illustrated an encapsulated MEMS bandpass filter device 200 in which the resonator 202 lies at 900° with respect to the structure described and shown in FIG. 2. Thus, input conductor 201 covers the buried cavity 203 in which the MEMS resonator 202 is suspended. The resonator is made conducting by a deep implantation 206 which electrically connects it to an output conductor 205, and also to a tuning conductor 207. The device 200 has the advantage over the structure illustrated in FIG. 2 in that there is less area overlap, and hence less capacitive coupling between the input conductor 201 and the buried conducting layer 206. However, this structure may require more steps to fabricate, and hence, more costly to manufacture.

In accordance with the invention, the process used to fabricate each of the encapsulated MEMS resonator bandpass filter devices may utilize silicon on insulator (SOI) substrates as the starting material. This material consists of a silicon wafer with a thin layers of $SiO_2$ and single crystal silicon on its surface (the silicon is the outmost layer). Such wafers are commercially available and are made using a variety of techniques. It is understood that the processes described herein are also applicable to silicon wafers only partially covered with SOI material. These wafers are constructed using the widely known SIMOX process (Separation by IMplanted OXygen) wherein only small areas of the surface are converted by using masks to form isolated areas of SOI material. Further, as will be described in greater detail hereinbelow in view of FIGS. 6(a) and 6(b), the devices may be constructed by evacuating a trench in the surface of a silicon wafer, and depositing layers of material corresponding to those illustrated in view of FIG. 5(a). The fabrication of the resonators would be similar to that described for SOI starting materials, except the final resonator will be polycrystalline or amorphous silicon.

Typically, SOI wafers may be constructed with the topmost single crystal silicon being about 200 nm thick, the $SiO_2$ being 400 nm thick, and the substrate being several hundred microns thick. Other layer thickness of SOI substrates are available, and all are compatible with the processes described herein.

FIGS. 5(a)–5(k) illustrate the process steps in manufacturing a SOI encapsulated MEMS device, e.g., having the resonator structure shown in FIG. 2(a).

Figure 5A:
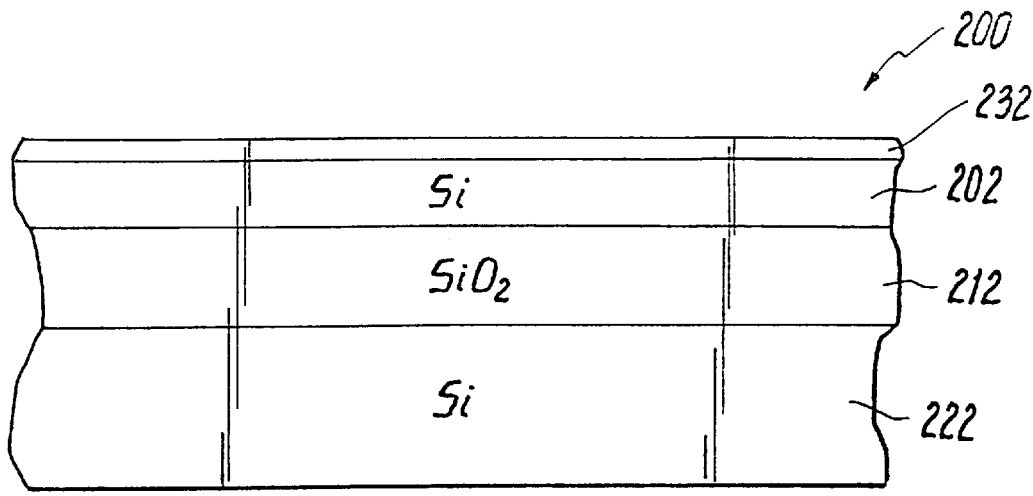
FIGS. 5(a)–5(i) illustrate the various steps and masks used in construction of the encapsulated MEMS bandpass filter device, and also depicts intermediate structures during the fabrication process.
Figure 5B:
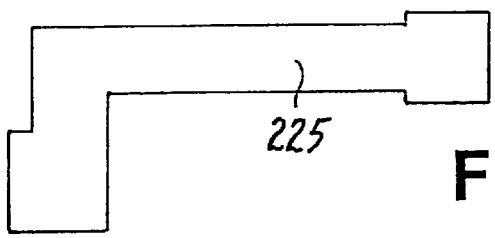

As shown in the cross-sectional view of FIG. 5(a), a clean p-type SOI wafer 200 is provided, having a surface silicon layer 202, an intermediate layer of $SiO_2$ 212 on the substrate silicon 222. For purposes of discussion, it is assumed that the surface silicon layer 202 is about 200 nm thick, the intermediate $SiO_2$ layer 212 is about 400 nm thick and, the silicon substrate 222 is p-type silicon, of nominal 10 Ω-cm resistivity. It is understood that none of these thickness specifications are critical to the device construction, and are used only for purposes of illustration. Next, as shown in FIG. 5(a) in a second step, a top layer 232 of $SiO_2$ is deposited on the wafer having a thickness of about 30 nm, for example (not shown). Then, in a third step, a thick photoresist layer (not shown) is applied, and implementing photolithographic technique, a structure 225 as shown in FIG. 5(b), is opened which represents a first mask. This first mask outlines the deep implant layer 106 which connects the tuning contact 107 to the resonator 102, makes the resonator conducting, and finally connects the resonator to the output contact 105 (FIG. 2(a)). Thus, in a fourth step not shown, phosphorus ions are implanted, for example, at 95 keV to a dose of $10^{15}/cm^2$ through the mask 225 opening. This will create an n+ layer in the substrate, just below the $SiO_2$ layer, and spatially limited by the mask 225 of FIG. 5(b). Because the silicon layer is p-type, this n-type conducting layer will be electrically isolated from the silicon layer.

Then, the photoresist applied for fabricating opening structure 225 is removed in a fifth step. It may be convenient to anneal the wafer at this point to remove the radiation damage from the implants, and to activate the phosphorus. A typical anneal would be in forming gas at about 950° C. for about 30 minutes.

Figure 5C:
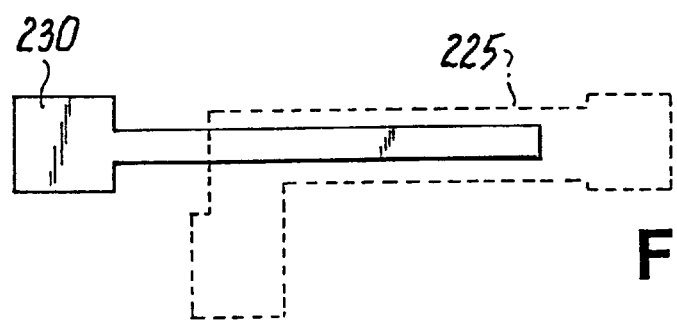

Next, in a sixth step, a new photoresist coating is applied and a photolithographic technique is implemented to open a structure 230 as shown in FIG. 5(c), which represents a second mask. This mask is used to create the metal layer above the resonator, and be the self-alignment structure for the band-pass filter. That is, the resonator will be constructed just below this layer, and its width will be defined by the width of this conductor (although its final width will be slightly smaller than the width of this metal layer). The positioning of this mask is shown relative to the implant mask 225 indicated by the dotted lines in FIG. 5(c). Next, in a seventh step, a layer of Molybdenum (Mo) metal, or like equivalent, is deposited to a thickness of about 100 nm according to the pattern defined second mask area. Then, the photoresist is removed, lifting off the Mo except for the area 230 exposed by the pattern of FIG. 5(c). At this point, in an eighth step, the structure may be annealed to make the Mo metal adhere to the underlying $SiO_2$. Typically this anneal may take place in forming gas at 400° C. for 30 minutes.

Figure 5D:
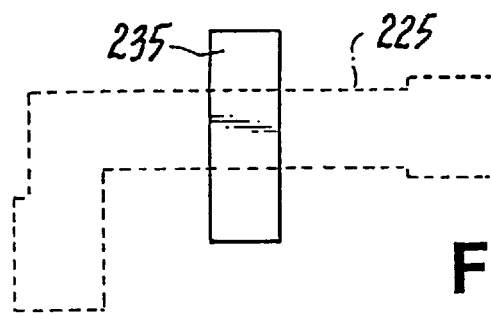

Then, in a ninth step, a new photoresist coating is applied and a photolithographic technique utilized to open a rectangular shape 235 shown in FIG. 5(d), which represents a third mask. The positioning of this third mask 235 is shown relative to the implant mask 225 indicated by the dotted lines as shown in FIG. 5(b). Also shown in FIG. 5(d) is the cross-sectional plane, labeled by dashed line A—A, which is the reference plane for the cross-sectional views shown in FIGS. 5(e)–5(i), as will be described in greater detail herein.

The opening in the photoresist as depicted by the third mask of FIG. 5(d) applied in the previous step, will be used to etch through the various layers, and create a resonator structure below the conductor. The resonator width will be determined by the width of the Mo metal, FIG. 5(c), and hence will automatically have the same basic shape (a self-aligned structure). After application of the photoresist, the structure will have the cross-section shown in FIG. 5(e), taken through the reference plane, A—A, as indicated in FIG. 5(d). This cross-sectional view illustrates the photoresist layer 240, labeled "PR", and the central metal strip 250 defined by the third mask 235. The substrate contains the following layers (with approximate thicknesses are shown in parenthesis): $SiO_2$ (30 nm), Si (200 nm), $SiO_2$ (400 nm) and the substrate silicon.

Figure 5E:
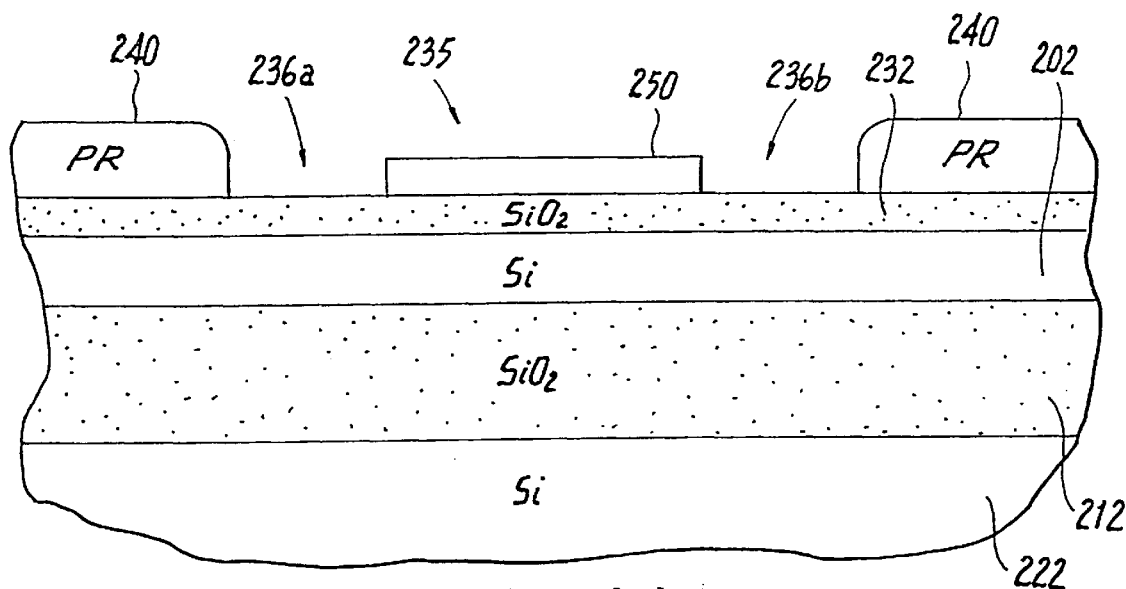

Then, in a tenth step, a reactive ion etching (RIE) technique is utilized to etch through the two rectangular areas 236a, 236b exposed on either side of the Mo metal by the third mask 235 (FIG. 5(e)). Typical RIE gases for this etch step is $CF_4+O_2(10\%)$, which plasma will etch down trenches 242, 244 through the surface $SiO_2$ (30 nm) and the underlying Si layer (200 nm) and partially into the lower $SiO_2$ layer. This etching step will result in the creation of a structure having a cross-section as depicted in FIG. 5(f) which illustrates the extent of each etched trench 242, 244 formed through the upper two substrate layers 232, 202, and partially into the third layer 212.

Figure 5F:
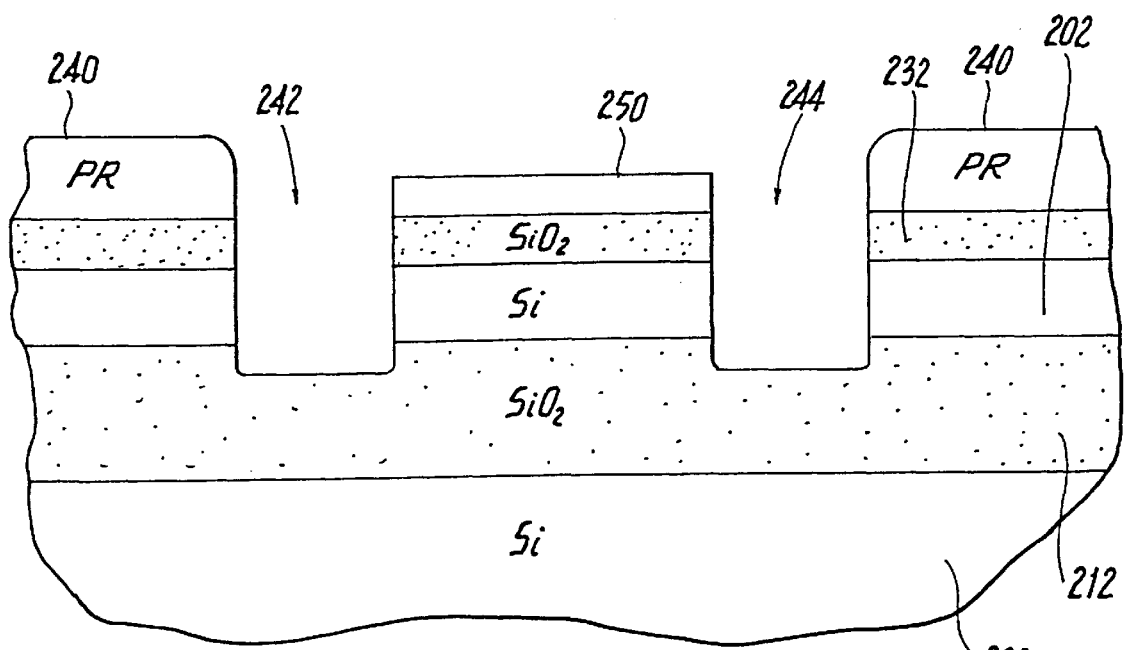
Figure 5G:
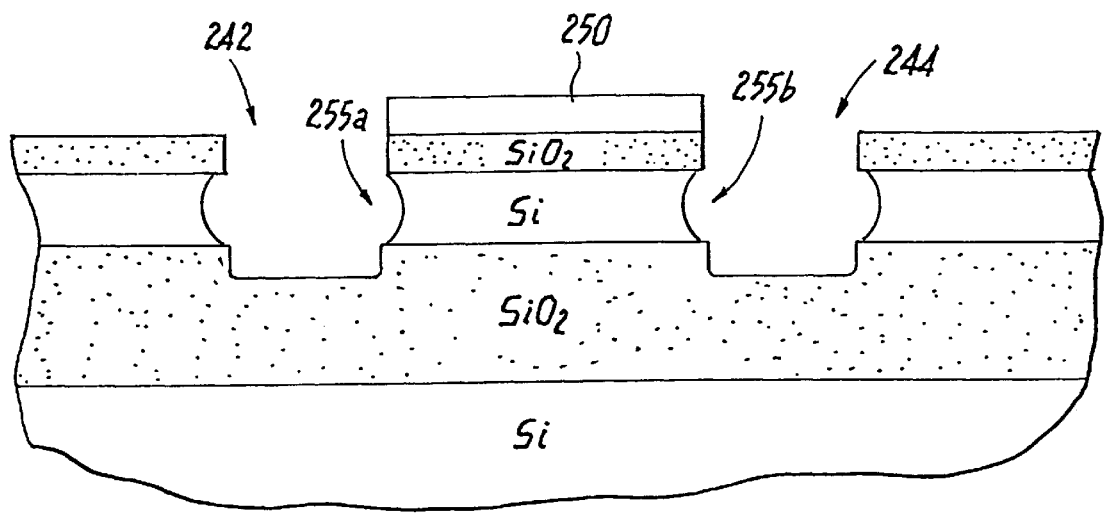

The next step (step 11) requires a removal of the photoresist layer 240 as shown in FIGS. 5(e) and 5(f). Then, a twelfth step is implemented to selectively etch the Si layer under the Mo metal, so that the final resonator will be slightly narrower than the Mo metal. A liquid etch such as Ethylene-Dimene-PyroCatehcol Pyrozine (EPPW) may be used which has an etch rate of Si more than 100:1 than that of $SiO_2$. The portions of silicon 255a,b under the Mo are etched back about 100 nm as shown in the resultant structure depicted in FIG. 5(g).

Figure 5H:
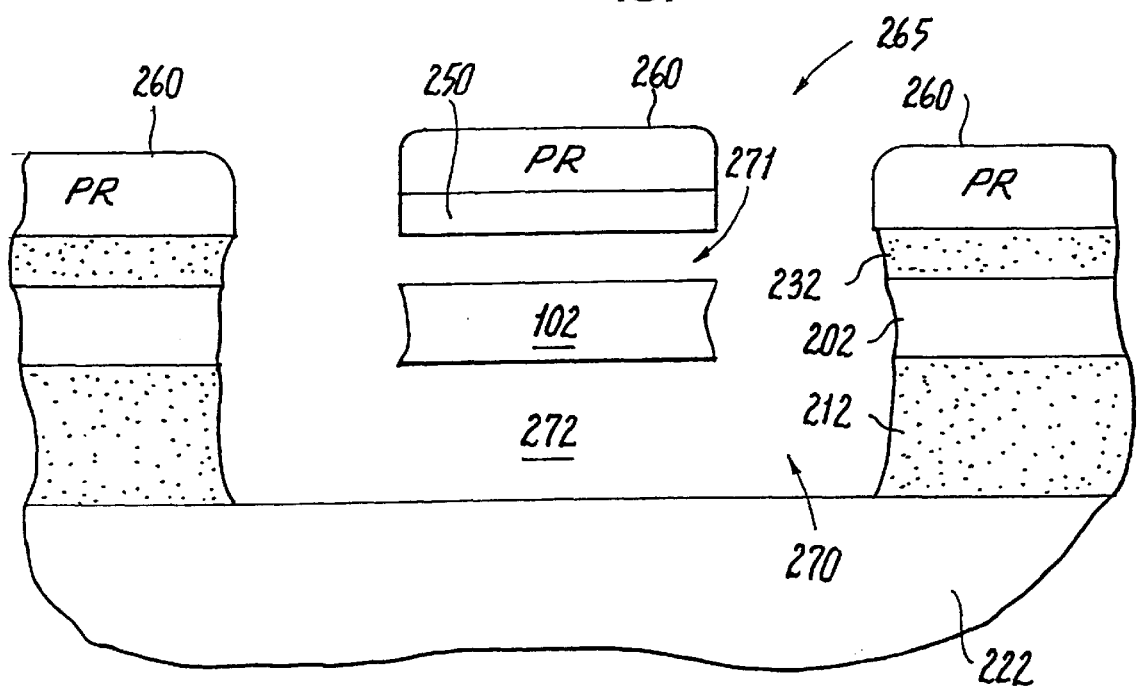

Then, in a thirteenth step, as shown in the cross-sectional view of FIG. 5(h), a photoresist layer 260 is applied and a photolithographic technique implemented to open a fourth mask structure 265. This fourth mask 265 is similar to the third mask structure 235 as shown in top-view in FIG. 5(d), except that it also covers the Mo layer 250 in the middle of the structure.

In the next step (step 14), an etchant such as buffered HF is used to etch down through the $SiO_2$ layers in an amount sufficient to fully remove the $SiO_2$ layers under and over the resonator 102. The result of this step is to leave a "well" structure 270 as shown in cross-section in FIG. 5(h), with the resonator 102 separated from the metal conductor 250 by the thickness of the $SiO_2$ layer 232 deposited in second step ($SiO_2$ application shown in FIG. 5(a)). The resonator 102 is now mechanically "free" with the removal of the $SiO_2$ layers above 271 and below 272 the resonator.

Figure 5I:
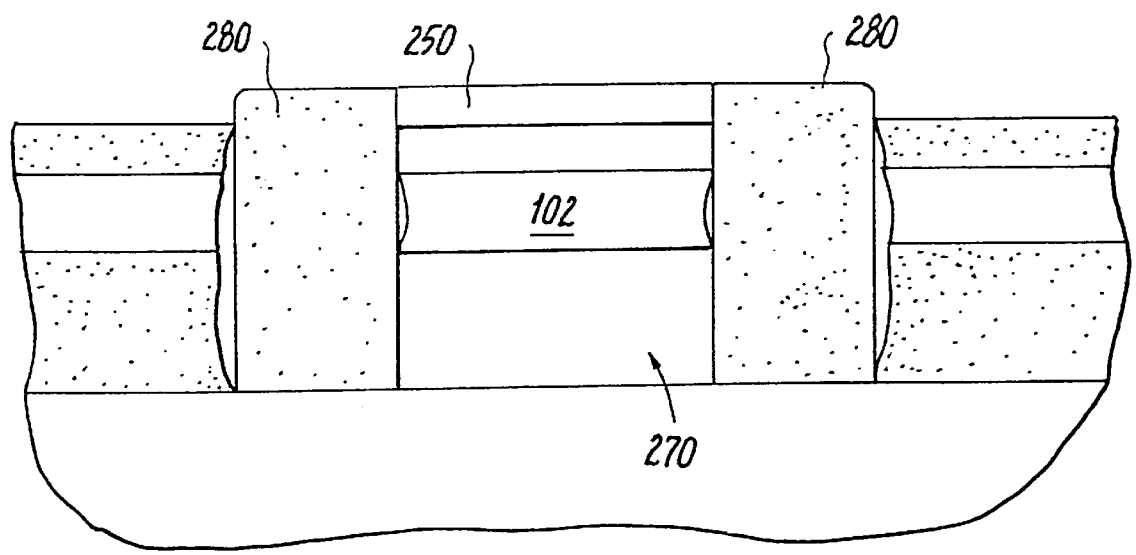

As a final step 15, $SiO_2$ is deposited in a vacuum process onto the structure, preferably commensurate in thickness to that as the well structure 270 etched in the previous step. Thus, as shown in FIG. 5(i), this results in the refill of the well 270 with $SiO_2$ layers 280 of approximately 730 nm in thickness, for example, on both sides of the conductor 250 and the resonator 102. Then, the layer of photoresist 260 is removed which will lift-off all the $SiO_2$ except which has refilled the etched well, leaving a structure as illustrated in FIG. 5(i). The resonator is now fully encapsulated in a vacuum.

Except for connection wiring to other circuit elements, the basic band-pass filter structure 100 illustrated in FIG. 2(a) is completed. The input signal is carried in the Mo conductor deposited in the seventh step. This signal is capacitively coupled to the MEMS resonator 102 constructed in step 14. This signal is then carried through the buried conductor 106 constructed by ion implantation in the fourth step to an output connector (not shown).

A third contact may make contact to the buried implant layer (see FIG. 2(a) and may be used for frequency tuning of the band-pass filter. A small current, for example, of about 10 mA, will raise the temperature of the resonator about 150° C., changing the resonator natural vibrational frequency and allowing the band-pass filter to be tuned. This contact may also be used to apply DC bias to pre-stress the resonator, changing its natural vibrational frequency.

As mentioned herein, the natural frequency of the resonator structure may be altered by ion implantation into the resonator at any stage of its construction. Such an implant may be done using the same mask 225 as described with respect to FIG. 5(b), above, and may follow the phosphorus implant process step 4. Such ion implantation may be used to alter the resonator elastic constant in two ways: (1) by changing the density of the material, or (2) by changing the internal bonding structure of the material. The general formula which describes the natural fundamental frequency of a resonator beam supported at both ends is derived in the reference entitled "Vibration and Sound", e.g., Chapter IV "The Vibration of Bars", by P. M. Morse, McGraw Hill Book Co., New York (1948), the contents of which are incorporated herein by reference, and set forth in equation (1) as follows:

$$\text{Fundamental Frequency} = K \frac{T}{L^2} \sqrt{\frac{Y}{\rho}} \qquad (1)$$

where K is a constant, T is the beam thickness, L is the beam length, Y is the elastic constant of the beam material, and ρ is the beam material density. Examples of. processes which may be used to alter the resonator frequency (after subsequent annealing) include the following:

1) Ion implantation of neutral light atoms such as carbon will, after anneal, maintain the same single-crystal structure of the resonator but lowers the resonator density, and hence raises its natural frequency of vibration. It is understood that neutral atoms are those which are chemically similar to silicon, and may be directly incorporated into the silicon crystal lattice.

2) Implantation of neutral heavy atoms such as germanium which raises the resonator material density, and lowers the natural frequency of vibration; and, 3) Implantation of dopant substitutional atoms such as B, As or P will change the local bonding of the silicon, and also effect the elastic constant of the resonator.

The resonator frequency may also be lowered by reducing the thickness of the resonator. This may be simply done by oxidizing and then etching the silicon prior to any processing, and reducing the thickness of the surface silicon The resonator frequency may also be raised by increasing the thickness of the resonator. This may be done by growing epitaxial silicon on the wafer prior to any other processing.

The resonator frequency may be also raised by the deposition of any material upon the resonator structure to increase its thickness. However, any material other than single-crystal silicon will degrade the device performance by introducing internal friction losses.

The width of the band-pass filter may be too narrow for some applications. This frequency width may be increased (widened) by ion implantation of the resonator surface with silicon atoms, partially converting it to polycrystalline or amorphous silicon. However, as noted above, internal friction from such materials reduces the device efficiency and also widens the band-pass by distorting the natural vibrational frequency.

The above process steps illustrated with respect to FIGS. 5(a)–5(i) are for fabricating a silicon crystal encapsulated MEMS resonator. However, the process described may also be used for resonators made of other materials. Polycrystalline resonators may be fabricated at low temperatures, and the mechanical limitations of using such materials may be tolerated for some applications. Multi-layer resonators may be fabricated using mixed materials, in which the mixed properties are superior to those of any individual material. For example, diamond-like-carbon (DLC) may be chosen to make a resonator with a stiff elastic constant (and hence a large natural vibrational frequency), and combine this with a metal to obtain good electrical conduction in the resonator. The DLC has an elastic constant of about 1500 Gpa (GigaPascals), in contrast to about 200 Gpa for single crystal silicon. Hence, the natural vibrational frequency will increase by the square root of the difference, i.e., about 2.7 times larger for the DLC material. Although DLC may be deposited with doping to improve its electrical conductivity, a thin bonded metal layer may be required to provide the necessary conductivity to the resonator without compromising on the elastic constant of the DLC as it is not currently known about how such doping will affect its elastic constant.

For a polycrystalline resonator, or a multi-layered resonator, the fabrication process requires several additional steps at the beginning of the fabrication cycle. These process steps are identified as steps 301–305 hereinbelow, so they will not be confused with steps 1–15 for the fabrication of single crystal silicon, described above. Once these steps are completed, the rest of the MEMS fabrication follows the outline of steps 2–15 (above). These new steps will create a filled trench as illustrated in cross-section in FIGS. 6(a) (polycrystalline resonator) and 6(b) (multi-layer resonator).

Figure 6A:
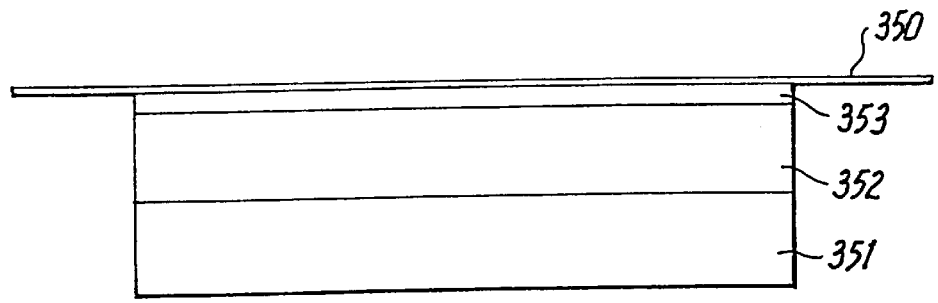
FIGS. 6(a) and 6(b) illustrate the initial cross-section of the layers used for the fabrication of poly crystalline resonators and multi-layer bonded resonator.

FIG. 6(a) illustrates a trench 350 etched into the substrate. This trench is slightly larger than the final MEMS device, but its surface area is not critical. Successive depositions will lay down layers of the lower release layer 351, the polycrystalline material for the resonator 352 and the upper release layer 353. When the MEMS device is completed, the layers 351 and 353 will be absent, and the resonator will be formed of the material 352.

Figure 6B:
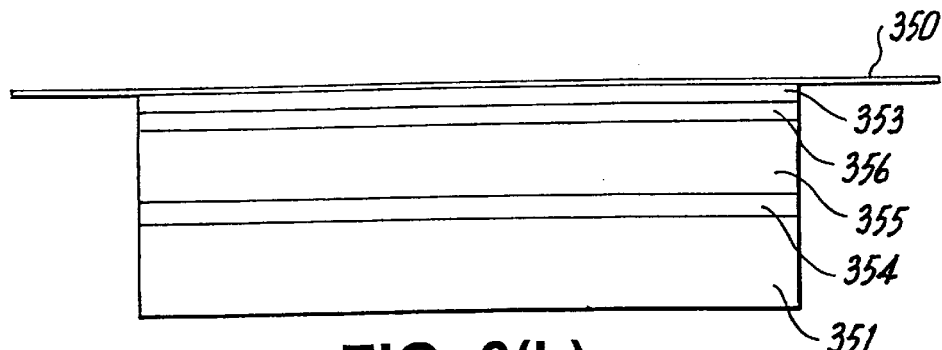

FIG. 6(b) illustrates a trench 350 etched into the substrate. This trench is slightly larger than the final MEMS device, but its surface area is not critical. Successive depositions will lay down layers of the lower release layer 351, several layers which will make up the resonator 354,355,356, and the upper release layer 353. When the MEMS device is completed, the layers 351 and 353 will be absent, and the resonator will be formed of the materials 354,355 and 356.

According to this embodiment of the invention, typical process steps include:

A step 300 which utilizes photoresist to open an area on the substrate surface slightly larger than the masks shown in FIGS. 5(b)–5(d). Etch a trench into the silicon, for example using reactive ion etching (RIE). For example, etching a rectangle about 4 mm×4 mm in area about 1 mm deep.

A next step 301 which requires the deposition of a "lower release layer" which will be later etched away. For example, a layer of $SiO_2$, of 670 nm thick, for example, is deposited using evaporation or sputter-deposition.

A next step 302 requires the deposition of the material which will be used as the resonator. For example, a layer of Si, 300 nm thick, may be deposited using evaporation or sputter-deposition. Alternatively, the resonator material may be made of several layers to obtain special material properties.

Next, a step 303 for depositing an "upper release layer" which will be later etched away. For example, a layer of $SiO_2$, 30 nm thick, may be deposited using evaporation or sputter-deposition.

Finally at step 304, the photoresist is removed, releasing the deposited materials everywhere except within the box etched in step 301 above.

After completing initial steps 301–304, the cross-section of the device will be as illustrated in depicted in FIGS. 6(a) and FIG. 6(b) for both the polysilicon resonator and the DLC/metal resonator.

The processing of this MEMS device may then proceed as herein described for the single-crystal silicon resonator, process steps 2–15. Masks 1–3 (FIGS. 5(b)–5(d)) will be placed within the area fabricated above in step 301. Only two process steps need to be changed. The deep etch described in step 10, FIG. 5(f), must be able to etch through the resonator material deposited in step 302. Also, the side-etch used in step 12, FIG. 5(g), must be an etch which is selective in etching the resonator material, while having little etching effect on the other materials in the trench. Hence, the suggested EPPW etchant may need to be changed to an etchant material specific for the resonator material chosen. Other than these two changes, the process of the device construction is similar to that described for making a single-crystal silicon MEMS device, discussed in process steps 2–15 herein.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. An encapsulated integrated circuit bandpass filter device comprising:
   a) a substrate including a vacuum gap formed beneath a surface metal layer for conducting an input signal to said device, said metal layer lying along a linear dimension; and, b) a conductive resonator structure having first and second contact ends and a middle portion exposed completely within said vacuum gap along said linear dimension, one of said first and second contact ends for propagating an output signal from said device, whereby an input signal is capacitively coupled from said metal layer to said conductive resonator structure to enable vibration of said resonator device within said gap in a vertical direction at a desired frequency of vibration.

2. The device as claimed in claim 1, wherein said metal layer is of a defined width, said conductive resonator structure having a width narrower than the defined width of said metal layer along said gap.

3. The device as claimed in claim 1, wherein said second conductive contact end is formed at a surface at an opposite side of said vacuum gap structure for enabling injection of electrical stimulus for heating said resonator structure and altering its frequency of vibration.

4. The device as claimed in claim 1, wherein said conductive resonator structure comprises single crystal silicon material.

5. The device as claimed in claim 1, wherein said conductive resonator structure comprises poly-crystalline silicon material.

6. The device as claimed in claim 1, wherein said conductive resonator structure comprises amorphous silicon.

7. The device as claimed in claim 1, wherein said conductive resonator structure is multi-layered.

8. The device as claimed in claim 1, wherein said resonator structure comprises a material for altering a band-pass frequency of vibration, said material selected from a group consisting of: carbon atoms, germanium, boron, and arsenic.

9. An encapsulated integrated circuit bandpass filter device comprising:

a) a substrate including a vacuum gap formed beneath a surface metal layer for conducting an input signal to said device, said metal layer lying along a linear dimension; and, b) a conductive resonator structure having first and second contact ends and a middle portion exposed completely within said vacuum gap and lying transverse to said linear dimension, one of said first and second for propagating an output signal from said device, whereby an input signal is capacitively coupled from said metal layer to said conductive resonator structure to enable vibration of said resonator device within said gap in a vertical direction at a desired frequency of vibration.

10. The device as claimed in claim 9, wherein said second conductive contact end is formed at a surface at an opposite side of said open well structure for enabling injection of electrical stimulus for heating said resonator structure and altering its frequency of vibration.

11. The device as claimed in claim 9, wherein said conductive resonator structure comprises single crystal silicon material.

12. The device as claimed in claim 9, wherein said conductive resonator structure comprises poly-crystalline silicon material.

13. The device as claimed in claim 9, wherein said conductive resonator structure comprises amorphous silicon.

14. The device as claimed in claim 9, wherein said conductive resonator structure is multi-layered.

15. The device as claimed in claim 9, wherein said resonator structure comprises a material for altering a band-pass frequency of vibration, said material selected from a group consisting of: carbon atoms, germanium, boron, and arsenic.

* * * * *